United States Patent
Yaung et al.

(10) Patent No.: US 6,232,194 B1
(45) Date of Patent: May 15, 2001

(54) SILICON NITRIDE CAPPED POLY RESISTOR WITH SAC PROCESS

(75) Inventors: Dun-Nian Yaung, Taipei; Shou-Gwo Wuu, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/434,921

(22) Filed: Nov. 5, 1999

(51) Int. Cl.⁷ .................... H01L 21/20; H01L 21/8244
(52) U.S. Cl. .................. 438/382; 438/381; 438/383; 438/384; 438/385; 438/238
(58) Field of Search .................... 438/382–385, 438/238, 381

(56) References Cited

U.S. PATENT DOCUMENTS

| | | | |
|---|---|---|---|
| 4,408,385 | * 10/1983 | Mahan Rao et al. | 29/576 |
| 4,592,128 | 6/1986 | Bourassa | 29/571 |
| 4,604,789 | 8/1986 | Bourassa | 29/576 C |
| 4,641,173 | 2/1987 | Malhi et al. | 357/51 |
| 5,108,945 | 4/1992 | Matthews | 437/60 |
| 5,384,278 | 1/1995 | Singlevich | 437/52 |
| 5,461,000 | * 10/1995 | Liang | 437/60 |
| 5,500,553 | 3/1996 | Ikegami | 257/538 |
| 5,728,615 | 3/1998 | Cheng et al. | 438/238 |
| 5,824,579 | * 10/1998 | Subramanian et al. | 438/238 |
| 5,834,815 | 11/1998 | Cheng et al. | 257/379 |
| 6,069,063 | * 5/2000 | Chang et al. | 438/528 |
| 6,100,154 | * 8/2000 | Hsu et al. | 438/385 |
| B1 6,184,103 | * 2/2001 | Li et al. | 438/382 |

* cited by examiner

*Primary Examiner*—Richard Booth
*Assistant Examiner*—Jennifer M. Kennedy
(74) *Attorney, Agent, or Firm*—George O. Saile; Stephen B. Ackerman; Rosemary L. S. Pike

(57) ABSTRACT

A new method of forming a polysilicon resistor having precisely controlled resistance by using a thin silicon nitride cap over the polysilicon resistor is described. A dielectric layer is provided on a semiconductor substrate. A polysilicon layer is deposited overlying the dielectric layer and patterned to form a polysilicon resistor. A silicon nitride capping layer having a thickness of not more than 100 Angstroms is deposited overlying the polysilicon resistor and dielectric layer. An interlevel dielectric layer is deposited overlying the silicon nitride capping layer. The substrate is annealed thereby densifying the silicon nitride capping layer. A self-aligned contact opening may be made through the interlevel dielectric layer, the silicon nitride capping layer, and the dielectric layer to underlying device structures. The capping silicon nitride layer is thin enough not to act as an etch stop in the self-aligned contact etching. The contact opening is filled with a conducting layer. A passivation layer is deposited overlying the conducting layer wherein the passivation layer contains hydrogen atoms and wherein the silicon nitride capping layer prevents the hydrogen atoms from penetrating the polysilicon resistor.

18 Claims, 5 Drawing Sheets

SILICON NITRIDE CAPPED POLY RESISTOR WITH SAC PROCESS

BACKGROUND OF THE INVENTION (1) Field of the Invention

The invention relates to a method of forming polysilicon resistors in the fabrication of integrated circuits, and more particularly, to a method of forming polysilicon resistors with precisely controlled resistance in the manufacture of integrated circuits.

(2) Description of the Prior Art

Polysilicon resistors have been used extensively in Very Large Scale Integrated circuits (VLSI), such as analog to digital converters and poly-load static random access memories (SRAM). An unfortunate characteristic of polysilicon resistors is their ability to absorb hydrogen to which the resistors are exposed during semiconductor processing. This results in resistance reduction and fluctuation of the resistors. Hydrogen penetration, as well as etch and chemical mechanical polishing (CMP) impact of backend processes, make it difficult to control resistance values precisely.

It has been shown that a metal shield over a polysilicon resistor will reduce the resistance variation of the resistor by avoiding hydrogen penetration. However, the extension of the metal to polysilicon affects the performance of the poly-resistor. The chip size can be enlarged to meet the tight control requirements of the poly resistor, but this is undesirable for cost-efficiency reasons. Double resistor load implantation (P+$BF_2$) has been proposed to decrease the temperature coefficient of the poly load thereby improving the cell stability of the poly-load SRAM. However, the sensitivity of the poly resistance to implant dosage is too high for manufacturing.

A silicon nitride capping layer has been used to prevent hydrogen diffusion into the polysilicon resistor. For example, U.S. Pat. No. 5,461,000 to Liang and U.S. Pat. No. 5,108,945 to Matthews teach a silicon nitride layer in the range of 500 to 2500 Angstroms over the resistor. Co-pending U.S. Patent Application serial number 09/234.096 to Y. L. Hsu et al filed on Jan. 19, 1999 teaches a silicon nitride layer of 300 to 1000 Angstroms deposited by low pressure chemical vapor deposition (LPCVD). However, such a thick silicon nitride layer is incompatible with the self-aligned contact (SAC) process, which is widely used in SRAM and dynamic random access memory (DRAM) processes to reduce cell size, because the thicker (>100 Angstroms) nitride film acts as an etch stop in the highly selective SAC etch.

U.S. Pat. No. 5,500,553 to Ikegami teaches forming a metal cap over polysilicon resistors to equalize the change in resistance caused by hydrogen atoms diffusing into the polysilicon. U.S. Pat. No. 5,834,815 to Cheng et al also discloses a metal cap over the poly resistor. U.S. Pat. No. 5,384,278 to Singlevich and U.S. Pat. No. 4,604,789 to Bourassa disclose oxide capping layers over polysilicon. U.S. Pat. No. 4,592,128 to Bourassa employs nitride as an implant mask. U.S. Pat. No. 5,728,615 to Cheng et al teaches a thermal treatment in $N_2$ with a $H_2$ ambient to equalize the hydrogen concentration in a polysilicon resistor. No capping layer is used, but hydrogen is allowed to penetrate the resistor. U.S. Pat. No. 4,641,173 to Malhi et al show silicon nitride tunneling layers surrounding a vertical poly resistor. The resistance of a vertical resistor is not easy to control because load implantation cannot be used. In addition, while a silicon nitride cap is used to protect the poly resistor from the interpoly oxide, hydrogen atoms can still diffuse into the resistor.

SUMMARY OF THE INVENTION

Accordingly, it is a principal object of the present invention to provide an effective and very manufacturable method of fabricating a polysilicon resistor in the manufacture of integrated circuits.

A further object of the invention is to provide a method for forming a polysilicon resistor having precisely controlled resistance.

A still further object is to provide a method for forming a polysilicon resistor having precisely controlled resistance by using a thin silicon nitride cap over the polysilicon resistor.

Another object of the invention is to block the diffusion of hydrogen atoms into a polysilicon resistor by means of a thin silicon nitride capping layer.

Yet another object of the invention is to integrate the thin silicon nitride capped resistor with a self-aligned contact process.

In accordance with the objects of this invention a new method of forming a polysilicon resistor having precisely controlled resistance by using a thin silicon nitride cap over the polysilicon resistor is achieved. A dielectric layer is provided on a semiconductor substrate. A polysilicon layer is deposited overlying the dielectric layer and patterned to form a polysilicon resistor. A silicon nitride capping layer having a thickness of not more than 100 Angstroms is deposited overlying the polysilicon resistor and dielectric layer. An interlevel dielectric layer is deposited overlying the silicon nitride capping layer. The substrate is annealed thereby densifying the silicon nitride capping layer. A self-aligned contact opening may be made through the interlevel dielectric layer, the silicon nitride capping layer, and the dielectric layer to underlying device structures. The capping silicon nitride layer is thin enough not to act as an etch stop in the self-aligned contact etching. The contact opening is filled with a conducting layer. A passivation layer is deposited overlying the conducting layer wherein the passivation layer contains hydrogen atoms and wherein the silicon nitride capping layer prevents the hydrogen atoms from penetrating the polysilicon resistor.

BRIEF DESCRIPTION OF THE DRAWINGS

In the accompanying drawings forming a material part of this description, there is shown.

DESCRIPTION OF THE PREFERRED EMBODIMENTS

In the self-aligned contact (SAC) process, there is no extension rule between the first polysilicon layer and the contact due to the protective layer on the polysilicon; such as the silicon nitride stop layer on the oxide mask and oxide spacer or silicon nitride mask and nitride spacer. Thus, the cell size can be greatly reduced. However, during SAC definition, the etch module is still critical, so high etch selectivity of oxide to nitride is needed. Therefore, in combining the poly-resistor with the SAC process, one would think that a silicon nitride cap should be patterned to remain only over the poly resistor so as not to interfere with the SAC process. However, this process shows even worse resistance control than no silicon nitride cap because hydrogen from back end processing will penetrate to the poly-load through the underlying oxide layer. Thus, a thin global silicon nitride capping layer is proposed to resolve this problem by adjusting the thickness ratio of the silicon nitride film above the poly-load and the silicon nitride stop layer.

Figure 1:
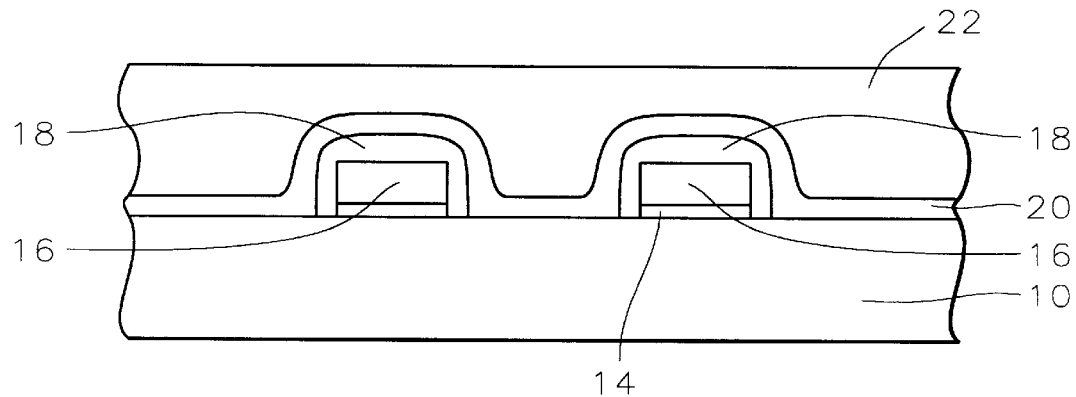
FIGS. 1 through 4 schematically illustrate in cross-sectional representation a preferred embodiment of the present invention.

Referring now more particularly to FIG. 1, there is illustrated a portion of a partially completed integrated circuit. There is shown a semiconductor substrate 10, preferably composed of monocrystalline silicon. A layer of polysilicon 16 is deposited over a gate oxide layer 14 and patterned to form gate electrodes as shown. A dielectric layer such as silicon oxide is deposited over the gate electrodes to form an oxide mask 18. A silicon nitride stop layer 20 having a thickness of about 500 to 800 Angstroms is deposited over the oxide mask, as shown. Now, an interpoly oxide (IPO) layer 22 is over the silicon nitride stop layer. This layer 22 may comprise silicon oxide, subatmospheric pressure chemically vapor deposited (SACVD) silicon oxide, or borophosphosilicate glass (BPSG) and have a thickness of between about 2000 and 3000 Angstroms.

Figure 2:
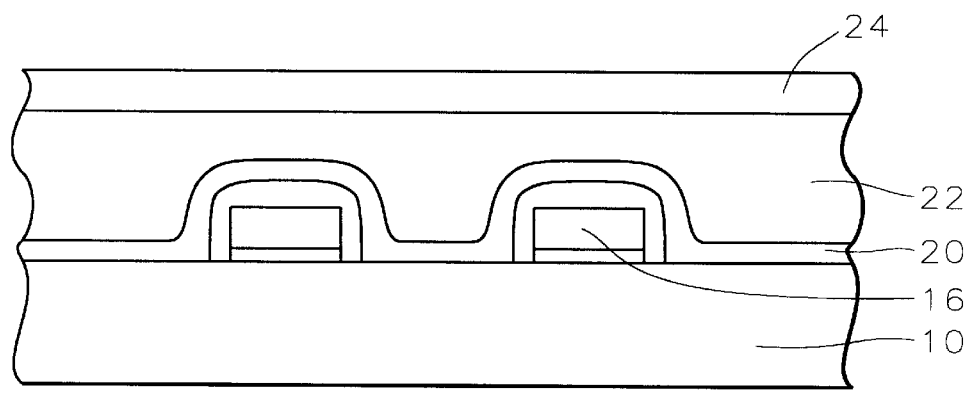

Referring now to FIG. 2, a second polysilicon layer 24 is deposited by LPCVD to a thickness of between about 500 and 700 Angstroms.

An ion implantation is made into the polysilicon layer 24 to form the high-value polysilicon resistor. For example, phosphorus ions are implanted into the polysilicon layer at a dosage of between about $10^{13}$ and $10^{14}$ atoms/cm$^2$ at an energy of between about 25 and 40 KeV.

Figure 3:
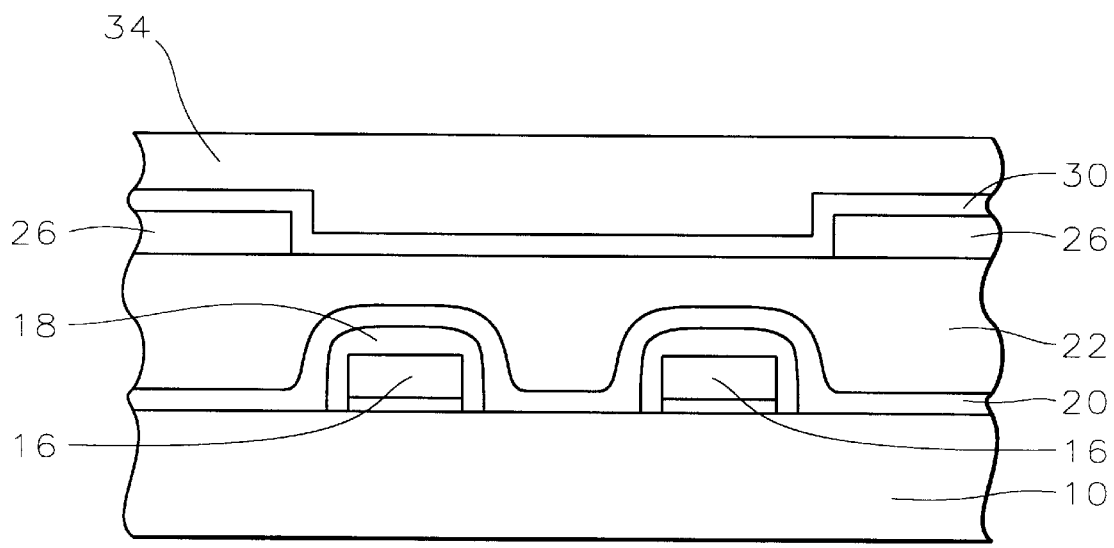

Next, referring to FIG. 3, the polysilicon layer 24 is patterned to form polysilicon resistors 26. A thin silicon nitride layer 30 is deposited by low pressure chemical vapor deposition (LPCVD) at a temperature of 620 to 650° C. to a thickness of between about 40 and 100 Angstroms, and preferably between 40 and 60 Angstroms.

Now, an interlevel dielectric layer 34 is deposited over the surface of the substrate. This may be a layer of undoped silicate glass (USG) or plasma-enhanced tetraethyloxysilane (PE-TEOS) oxide deposited to a thickness of between about 1000 and 2000 Angstroms and then planarized using chemical mechanical polishing (CMP) where the silicon nitride layer 30 acts as a polish stop.

Now, the substrate is subjected to a rapid thermal anneal (RTA) in a nitrogen ambient at between about 1000 and 1050° C. for 15 to 30 seconds. The RTA process will densify the USG layer 34 and the silicon nitride layer 30 so as to stop hydrogen penetration into the underlying poly resistors 26.

Figure 4:
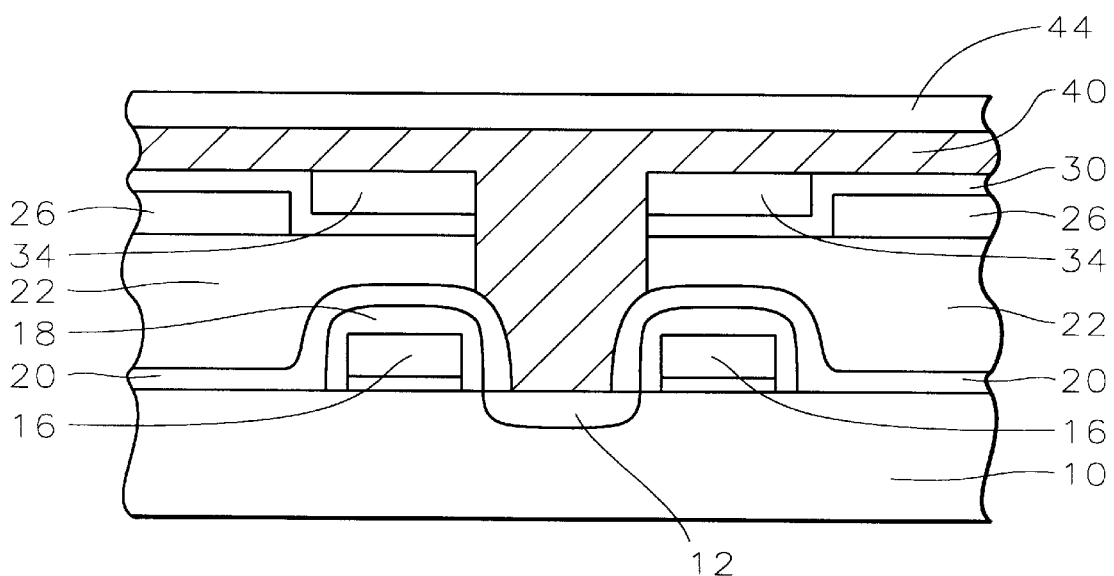

Now, referring to FIG. 4, a SAC process is performed. A contact opening is etched through the dielectric layers 34 and 22 to an underlying region to be contacted, such as source/drain region 12. The very thin silicon nitride layer 30 will not stop the etching of the contact opening, but the thicker silicon nitride stop layer 20 will protect the gates 16 from etching.

The contact opening is filled with metal 40. Contact openings, not shown, may be made to the polysilicon resistors 26 and contacts completed as is conventional. A passivation layer 44 is deposited overlying the metal layer 40. Typically, the passivation layer is PE oxide and/or PE silicon nitride having a thickness of between about 2000 and 7000 Angstroms over the surface of the substrate.

The thin global silicon nitride capping layer 30 with high temperature annealing prevents hydrogen atoms from the passivation layer, or other sources, from penetrating into the polysilicon resistor 26, resulting in precise resistance control of high-value polysilicon resistors.

The inventors have implemented the process of the invention and have tested it, as follows.

EXAMPLES

The following are given to show the important features of the invention and to aid in the understanding thereof. Variations may be made by one skilled in the art without departing from the spirit and scope of the invention.

To evaluate the influence of hydrogen diffusion, test structures were prepared. A first set of test structures had a metal shield formed over the resistor. A second set of test structures had no metal shield. The cumulative probability of polysilicon resistance of the first set of test structures is illustrated by the graph in FIG. 5. The cumulative probability of polysilicon resistance of the second set of test structures is illustrated by the graph in FIG. 6. Lines 51 and 61 illustrate the poly resistance of the test structure without the silicon nitride cap of the present invention. Line 51 shows a standard deviation of poly resistance with the metal shield (FIG. 5) of 52 giga-ohm/sq, which is about ⅓ of the mean value (152 giga-ohm/sq). The mean value of the poly resistance without the metal shield was greatly reduced to 15.9 giga-ohm/sq (line 61 on FIG. 6). Such large resistance variation has an impact on the distribution of stand-by current. The remaining test structures were capped with the thin silicon nitride film (45 Angstroms) of the present invention. The effects of patterning the silicon nitride layer to remain only over the resistors and the effects of RTA were investigated.

Figure 5:
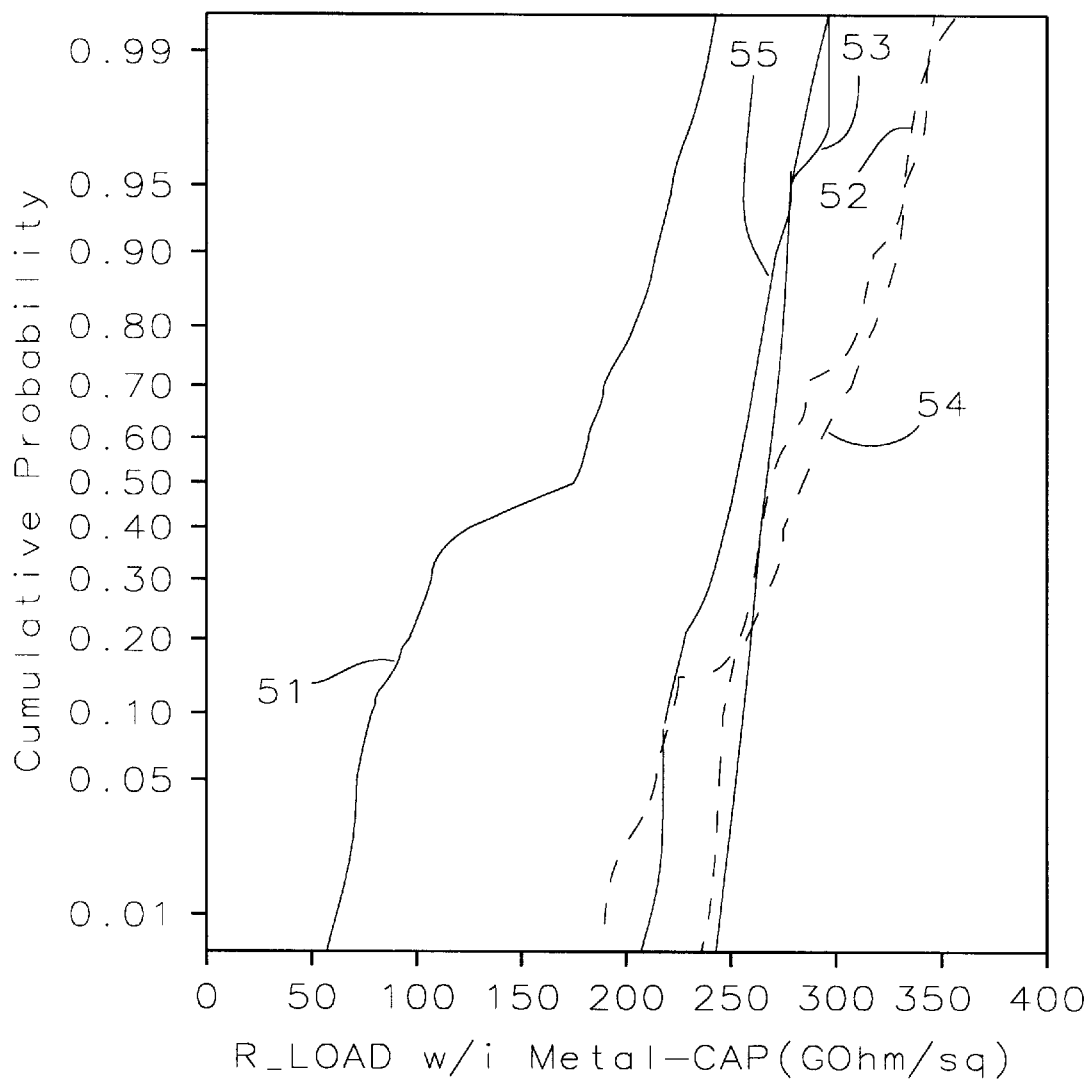
FIGS. 5 and 6 graphically illustrate the cumulative probability of polysilicon resistance for a first and second set of test structures, respectively.

Referring to FIG. 5 which shows the test structures including the metal shield, line 51 represents the structure having no silicon nitride cap. Line 52 shows the structure having a global silicon nitride cap with RTA before silicon nitride deposition. Line 53 represents the global silicon nitride cap with RTA after silicon nitride deposition. Line 54 shows the structure having silicon nitride cap only over the resistor with RTA before silicon nitride deposition. Line 55 represents the silicon nitride cap only over the resistor with RTA after silicon nitride deposition.

Figure 6:
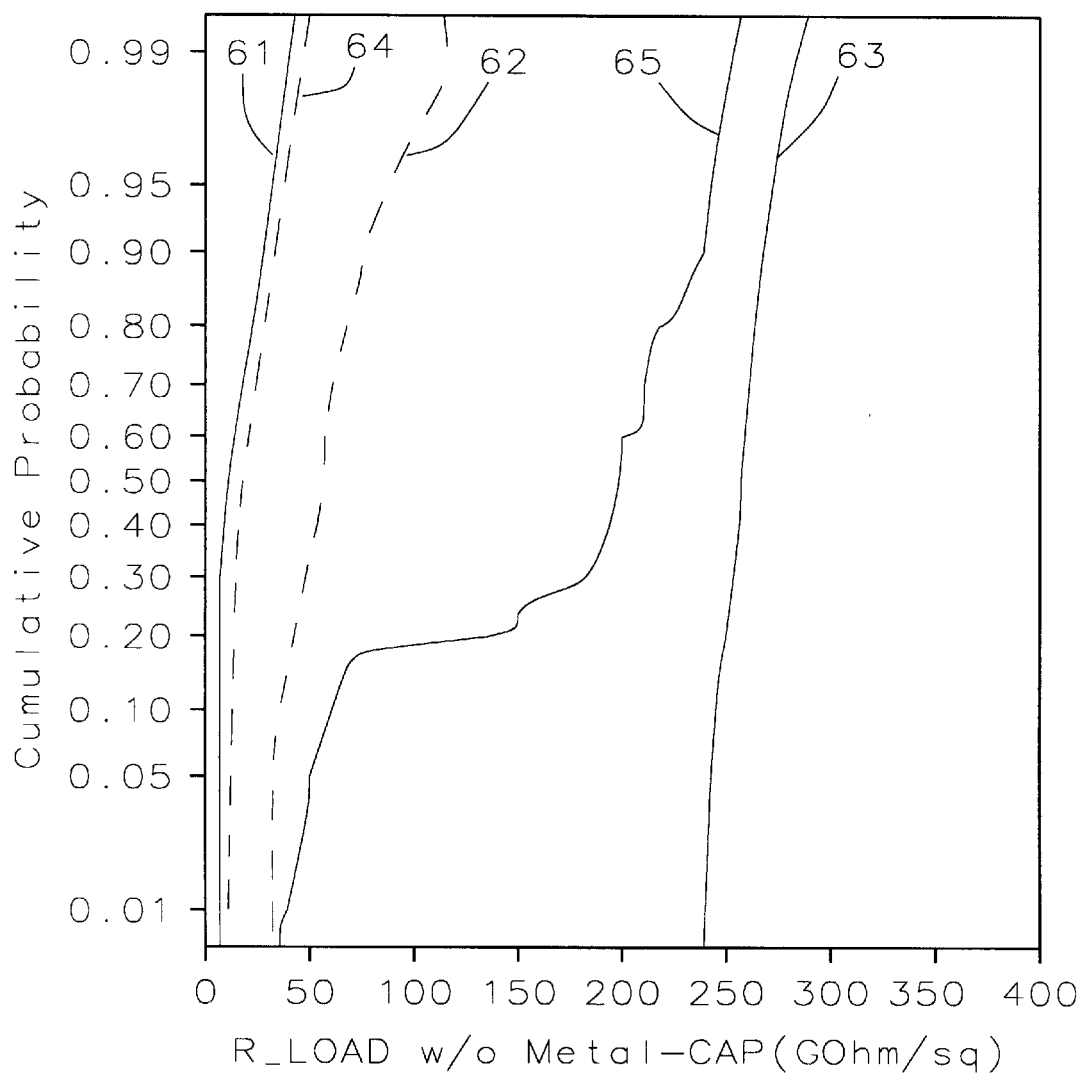

Referring to FIG. 6 which shows the test structures without the metal shield, line 61 represents the structure having no silicon nitride cap. Line 62 shows the structure having a global silicon nitride cap with RTA before silicon nitride deposition. Line 63 represents the global silicon nitride cap with RTA after silicon nitride deposition. Line 64 shows the structure having silicon nitride cap only over the resistor with RTA before silicon nitride deposition. Line 65 represents the silicon nitride cap only over the resistor with RTA after silicon nitride deposition.

The performance of the poly load is evaluated by uniformity, defined as the standard deviation divided by mean value, and hydrogen induced difference ratio, defined as the resistance difference between metal shield and no metal shield divided by poly resistance with metal shield.

The samples having a thin global silicon nitride cap with RTA after silicon nitride deposition (lines 53 and 63) show the best performance. The uniformity and difference ratio are significantly improved, from 34.2% to 3.6% and from 89.6% to 3.6%, respectively. The graphs show that the improvement is limited when RTA is performed before silicon nitride deposition. The resistors with the patterned silicon nitride cap showed worse performance than those with the global silicon nitride cap. This strongly suggests that the hydrogen diffusion path is not only through the upperside dielectrics, but it is also through the backside dielectrics and/or the polysilicon/dielectric interface in the case of the patterned silicon nitride cap.

Figure 7:
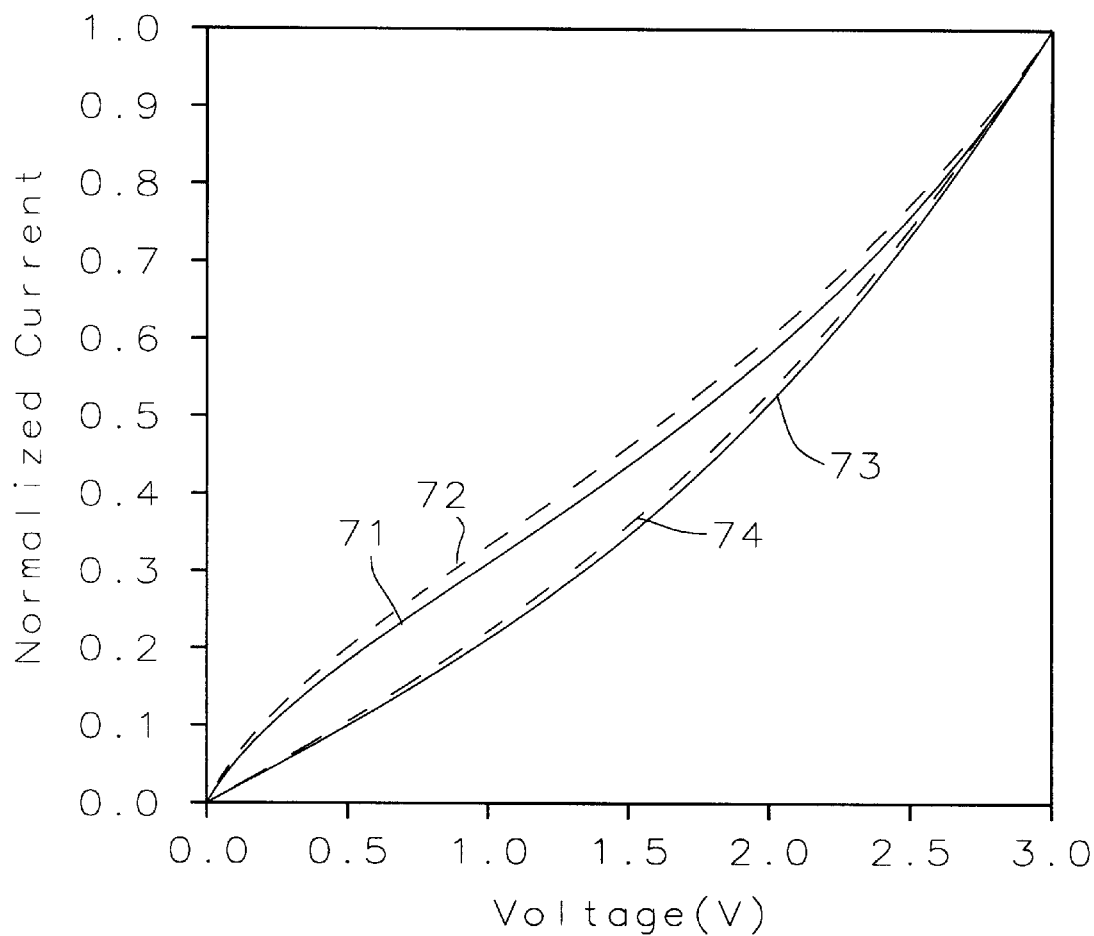
FIG. 7 graphically illustrates the I-V characteristics of the polysilicon resistor.

FIG. 7 illustrates the I-V characteristics of the polysilicon resistor with and without the thin nitride cap of the invention. The measured currents (I) are normalized by the current of $V_{supply}$=3V. The samples with the thin nitride cap (line 71 with metal shield and line 72 without metal shield) show better linearity than the samples without the thin nitride cap (line 73 with metal shield and line 74 without metal shield). As the linearity of the poly load increases, cell immunity to radiation increases, rise time decreases and voltage swing increases.

The process of the present invention provides a simple and effective method of achieving precise resistance control of high-value polysilicon resistors by implementing a global thin silicon nitride cap layer over the resistors and annealing at high temperature to densify the cap layer. The process of the invention can be used in any application which requires high-value polysilicon resistors and can be integrated into a SAC process since the silicon nitride cap layer is thin enough not to thwart the SAC etch.

While the invention has been particularly shown and described with reference to the preferred embodiments thereof, it will be understood by those skilled in the art that various changes in form and details may be made without departing from the spirit and scope of the invention.

What is claimed is:

1. A method of forming a polysilicon resistor in the fabrication of integrated circuits comprising:

providing a dielectric layer on a semiconductor substrate;

depositing a polysilicon layer overlying said dielectric layer;

patterning said polysilicon layer to form a polysilicon resistor;

depositing a silicon nitride capping layer having a thickness of not more than 100 Angstroms overlying said polysilicon resistor and said dielectric layer;

depositing an interlevel dielectric layer overlying said silicon nitride capping layer;

thereafter annealing said substrate thereby densifying said silicon nitride capping layer; and depositing a passivation layer overlying said interlevel dielectric layer wherein said passivation layer contains hydrogen atoms and wherein said silicon nitride capping layer prevents said hydrogen atoms from penetrating said polysilicon resistor.

2. The method according to claim 1 further comprising:

forming gate electrodes on a surface of said semiconductor substrate;

covering said gate electrodes with an oxide layer; and depositing an etch stop layer overlying said oxide layer wherein said gate electrodes, said oxide layer, and said etch stop layer underlie said dielectric layer;

and before said step of depositing said passivation layer, further comprising:

etching a contact opening through said interlevel dielectric layer, said silicon nitride capping layer, and said dielectric layer using a self-aligned contact process wherein said silicon nitride capping layer is thin enough not to act as an etch stop in said self-aligned contact process;

filling said contact opening with a conducting layer; and depositing said passivation layer overlying said conducting layer.

3. The method according to claim 1 wherein said polysilicon layer has a thickness of between about 500 and 700 Angstroms.

4. The method according to claim 1 wherein said silicon nitride capping layer has a thickness of between about 40 and 100 Angstroms.

5. The method according to claim 1 wherein said silicon nitride capping layer has a thickness of between about 40 and 60 Angstroms.

6. The method according to claim 1 wherein said step of annealing said substrate comprises exposing said substrate to a nitrogen ambient at a temperature of 1000 to 1050° C. for 15 to 30 seconds.

7. A method of forming a polysilicon resistor in the fabrication of integrated circuits comprising:

forming gate electrodes on a surface of said semiconductor substrate;

covering said gate electrodes with an oxide layer;

depositing an etch stop layer overlying said oxide layer;

depositing a polysilicon layer overlying said oxide layer;

patterning said polysilicon layer to form a polysilicon resistor;

depositing a silicon nitride capping layer having a thickness of not more than 100 Angstroms overlying said polysilicon resistor and said oxide layer;

depositing an interlevel dielectric layer overlying said silicon nitride capping layer;

thereafter annealing said substrate thereby densifying said silicon nitride capping layer;

etching a contact opening through said interlevel dielectric layer, said silicon nitride capping layer, and said oxide layer using a self-aligned contact process wherein said silicon nitride capping layer is thin enough not to act as an etch stop in said self-aligned contact process;

filling said contact opening with a conducting layer; and depositing a passivation layer overlying said conducting layer wherein said passivation layer contains hydrogen atoms and wherein said silicon nitride capping layer prevents said hydrogen atoms from penetrating said polysilicon resistor.

8. The method according to claim 7 wherein said etch stop layer comprises silicon nitride and has a thickness of between about 500 and 800 Angstroms.

9. The method according to claim 7 wherein said polysilicon layer has a thickness of between about 500 and 700 Angstroms.

10. The method according to claim 7 wherein said silicon nitride capping layer has a thickness of between about 40 and 100 Angstroms.

11. The method according to claim 7 wherein said silicon nitride capping layer has a thickness of between about 40 and 60 Angstroms.

12. The method according to claim 7 wherein said step of annealing said substrate comprises exposing said substrate to a nitrogen ambient at a temperature of 1000 to 1050° C. for 15 to 30 seconds.

13. A method of forming a polysilicon resistor in the fabrication of integrated circuits comprising:

forming gate electrodes on a surface of said semiconductor substrate;

covering said gate electrodes with an oxide layer;

depositing an etch stop layer overlying said oxide layer;

depositing a polysilicon layer overlying said oxide layer;

patterning said polysilicon layer to form a polysilicon resistor;

depositing a silicon nitride capping layer having a thickness of not more than 100 Angstroms overlying said polysilicon resistor and said oxide layer;

depositing an interlevel dielectric layer overlying said silicon nitride capping layer;

thereafter annealing said substrate using a rapid thermal annealing process thereby densifying said silicon nitride capping layer;

etching a contact opening through said interlevel dielectric layer, said silicon nitride capping layer, and said oxide layer using a self-aligned contact process wherein said silicon nitride capping layer is thin enough not to act as an etch stop in said self-aligned contact process;

filling said contact opening with a conducting layer; and depositing a passivation layer overlying said conducting layer wherein said passivation layer contains hydrogen atoms and wherein said silicon nitride capping layer prevents said hydrogen atoms from penetrating said polysilicon resistor.

14. The method according to claim 13 wherein said etch stop layer comprises silicon nitride and has a thickness of between about 500 and 800 Angstroms.

15. The method according to claim 13 wherein said polysilicon layer has a thickness of between about 500 and 700 Angstroms.

16. The method according to claim 13 wherein said silicon nitride capping layer has a thickness of between about 40 and 100 Angstroms.

17. The method according to claim 13 wherein said silicon nitride capping layer has a thickness of between about 40 and 60 Angstroms.

18. The method according to claim 13 wherein said step of annealing said substrate comprises exposing said substrate to a nitrogen ambient at a temperature of 1000 to 1050° C. for 15 to 30 seconds.

* * * * *